United States Patent
Kobayashi

(10) Patent No.: US 7,847,587 B2
(45) Date of Patent: Dec. 7, 2010

(54) SEMICONDUCTOR INTEGRATED CIRCUIT

(75) Inventor: Tomohiro Kobayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 12/400,816

(22) Filed: Mar. 10, 2009

(65) Prior Publication Data

US 2009/0267644 A1 Oct. 29, 2009

(30) Foreign Application Priority Data

Apr. 23, 2008 (JP) ............................. 2008-112692

(51) Int. Cl.
    *H03K 19/173* (2006.01)
(52) U.S. Cl. .................... 326/38; 326/47; 365/225.7; 327/525
(58) Field of Classification Search ............... 326/38, 326/47; 365/225.7; 327/525
    See application file for complete search history.

(56) References Cited

U.S. PATENT DOCUMENTS

| 5,467,027 | A | * | 11/1995 | Burton et al. ................. 326/38 |
| 5,731,733 | A | * | 3/1998 | Denham ...................... 327/525 |
| 7,405,590 | B1 | * | 7/2008 | Kaneko ........................ 326/38 |
| 7,701,226 | B2 | * | 4/2010 | Kaneko ...................... 324/550 |
| 2004/0090824 | A1 | * | 5/2004 | Takano et al. ............ 365/185.2 |

OTHER PUBLICATIONS

Alavi et al, A PROM Element Based on Salicide Agglomeration of Poly Fuses in a CMOS Logic Process, Technical Digest IEDM 1997, p. 855-858.
Safran et al, A Compact eFUSE Programmable Array Memory for SOI CMOS, IBM Microelectronics Division, Symposium on VLSI Digest of Technical Papers, 2007.
Chung et al, A 512×8 Electrical Fuse Memory with 15um2 Cells Using 8-sq Asymmetric Fuse and Core Devices in 90 nm CMOS, Symposium on VLSI Circuits of Technical Papers, 2007.

* cited by examiner

*Primary Examiner*—James H. Cho
*Assistant Examiner*—Jason Crawford
(74) *Attorney, Agent, or Firm*—Turocy & Watson, LLP

(57) ABSTRACT

A semiconductor integrated circuit has a voltage supply terminal; a first input terminal fed with a first input signal; an output terminal that outputs an output signal; a second input terminal fed with a second input signal; a first MOS transistor having one end connected to the voltage supply terminal and a gate electrode connected to the first input terminal; a second MOS transistor having one end connected to a first potential, an other end connected to the output terminal, and a gate electrode connected to the second input terminal; and a program element acting as a MOS transistor having one end connected to the other end of the second MOS transistor and an other end connected to a second potential higher than the first potential.

20 Claims, 13 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2008-112692, filed on Apr. 23, 2008, the entire contents of which are incorporated herein by reference.

BACKGROUND OF THE INVENTION

1. Field of the Invention

The present invention relates to a semiconductor integrated circuit used for fuses.

2. Background Art

In the prior art, electrical fuses provided in semiconductor integrated circuit include, for example, poly fuses (for example, see Mohsen Alavi, Mark Bohr, Jeff Hicks, Martin Denham, Allen Cassens, Dave Douglas, Min-Chun Tsai, "A PROM Element Based on Salicide Agglomeration of Poly Fuses in a CMOS Logic Process" Technical Digest of IEDM 1997, p. 855-858).

Such a poly fuse is programmed by, for example, a blowout caused by a predetermined current fed through a MOS transistor for writing.

During writing, the poly fuse is fed with a reading current by controlling a MOS transistor for reading which is connected to the poly fuse. After that, the value of current passing through the poly fuse or a current generated according to the state of the poly fuse is converted to a voltage, and the voltage is read as data.

In this way, the fuse (element) to be programmed and the MOS transistor for reading are separately provided.

Thus it is not possible to improve the degree of integration of circuits.

SUMMARY OF THE INVENTION

According to one aspect of the present invention, there is provided: a semiconductor integrated circuit, comprising:
a voltage supply terminal;
a first input terminal fed with a first input signal;
an output terminal that outputs an output signal;
a second input terminal fed with a second input signal;
a first MOS transistor having one end connected to the voltage supply terminal and a gate electrode connected to the first input terminal;
a second MOS transistor having one end connected to a first potential, an other end connected to the output terminal, and a gate electrode connected to the second input terminal; and
a program element acting as a MOS transistor having one end connected to the other end of the second MOS transistor and an other end connected to a second potential higher than the first potential,
wherein the program element includes a gate electrode having one end connected to an other end of the first MOS transistor and an other end connected to a ground potential and including a polysilicon film formed on a gate insulating film and a silicide film formed on the polysilicon film,
in a writing mode for writing data into the program element,
the voltage supply terminal has a potential set at a positive writing potential and the first MOS transistor is turned on for a predetermined period by the first input signal, so that electro migration is caused to occur on the silicide film, and in a reading mode for reading data stored in the program element,
the voltage supply terminal has a potential set at a positive reading potential lower than the writing potential, the first MOS transistor is turned on for a predetermined period by the first input signal, and then the second MOS transistor is turned on for a predetermined period by the second input signal.

According to another aspect of the present invention, there is provided: a semiconductor integrated circuit, comprising:
a voltage supply terminal;
a first input terminal fed with a first input signal;
an output terminal that outputs an output signal;
a second input terminal fed with a second input signal;
a first MOS transistor having one end connected to the voltage supply terminal and a gate electrode connected to the first input terminal;
a second MOS transistor having one end connected to a first potential, an other end connected to the output terminal, and a gate electrode connected to the second input terminal; and
a program element acting as a MOS transistor having one end connected to the other end of the second MOS transistor and an other end connected to a second potential lower than the first potential,
wherein the program element includes a gate electrode having one end connected to an other end of the first MOS transistor and an other end connected to a ground potential and including a polysilicon film formed on a gate insulating film and a silicide film formed on the polysilicon film,
in a writing mode for writing data into the program element,
the voltage supply terminal has a potential set at a positive writing potential and the first MOS transistor is turned on for a predetermined period by the first input signal, so that electro migration is caused to occur on the silicide film, and
in a reading mode for reading data stored in the program element,
the voltage supply terminal has a potential set at a positive reading potential lower than the writing potential, the second MOS transistor is turned on for a predetermined period by the second input signal, and then the first MOS transistor is turned on for a predetermined period by the first input signal.

According to further aspect of the present invention, there is provided: a semiconductor integrated circuit, comprising:
a voltage supply terminal;
a first input terminal fed with a first input signal;
an output terminal that outputs an output signal;
a second input terminal fed with a second input signal;
a first MOS transistor having one end connected to the voltage supply terminal and a gate electrode connected to the first input terminal;
a second MOS transistor having one end connected to a first potential, an other end connected to the output terminal, and a gate electrode connected to the second input terminal; and
a program element acting as a MOS transistor having one end connected to the other end of the second MOS transistor and an other end connected to a second potential lower than the first potential,
wherein the program element includes a gate electrode having one end connected to an other end of the first MOS transistor and an other end connected to a ground potential and including a polysilicon film formed on a gate insulating film and a silicide film formed on the polysilicon film.

DETAILED DESCRIPTION

In a semiconductor integrated circuit of the present invention, the gate electrode of a MOS transistor is electrically programmed. Further, it is determined whether the gate electrode has been programmed or not, based on a source-drain voltage or a current when the gate voltage is changed.

The following will describe embodiments of the present invention in accordance with the accompanying drawings.

First Embodiment

Figure 1:
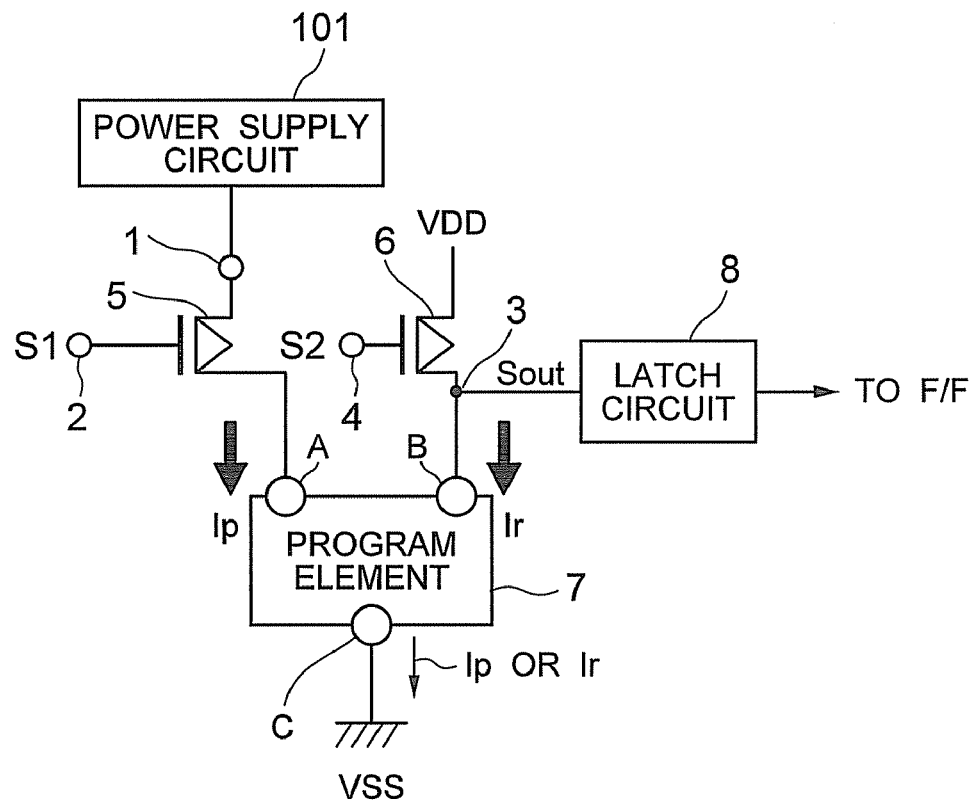
FIG. 1 is a figure showing the configuration of the main part of a semiconductor integrated circuit 100 according to a first embodiment which is an aspect of the present invention.
Figure 2A:
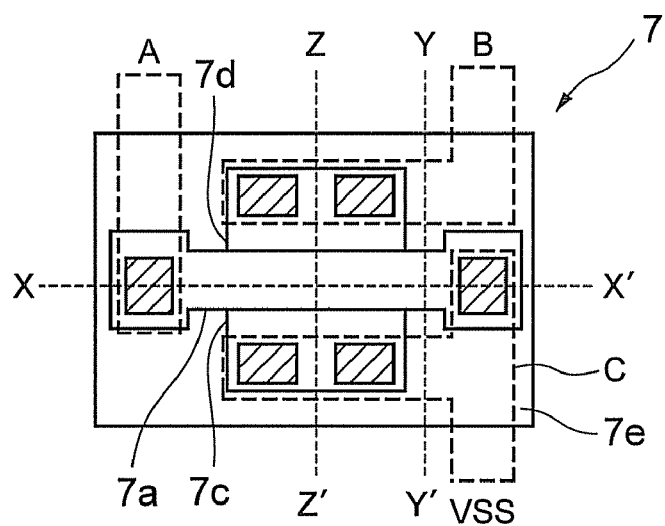
FIG. 2A is a figure showing an example of the layout of a program element 7 shown in FIG. 1.
Figure 2B:
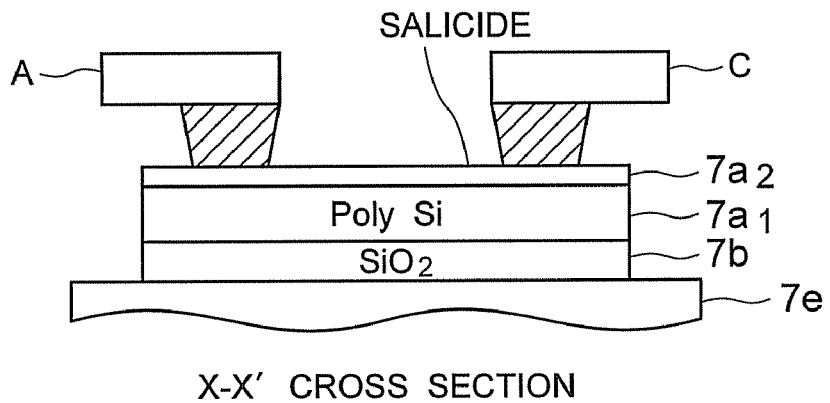
FIG. 2B is a sectional view showing a cross section taken along line X-X' of the program element 7 shown in FIG. 2A.
Figure 2C:
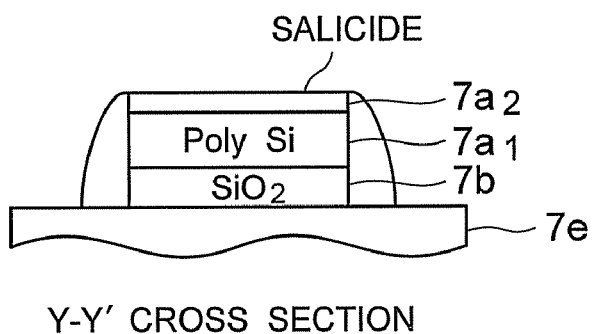
FIG. 2C is a sectional view showing a cross section taken along line Y-Y' of the program element 7 shown in FIG. 2A.
Figure 2D:
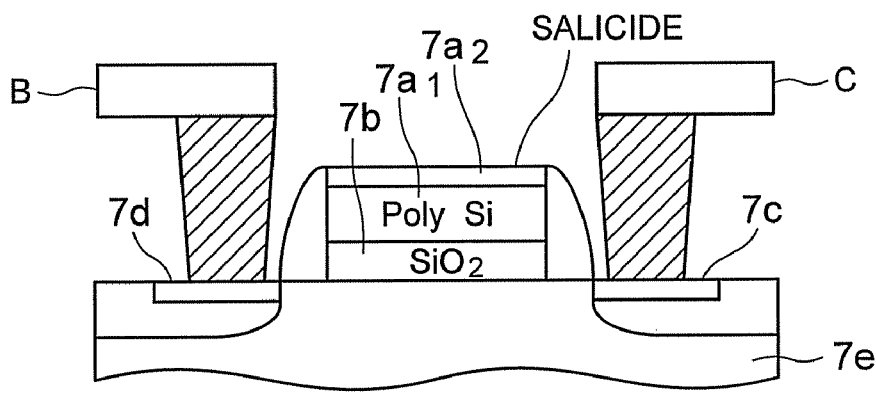
FIG. 2D is a sectional view showing a cross section taken along line Z-Z' of the program element 7 shown in FIG. 2A.

FIG. 1 shows the configuration of the main part of a semiconductor integrated circuit 100 according to a first embodiment which is an aspect of the present invention. FIG. 2A shows an example of the layout of a program element 7 shown in FIG. 1. FIG. 2B is a sectional view showing a cross section taken along line X-X' of the program element 7 shown in FIG. 2A. FIG. 2C is a sectional view showing a cross section taken along line Y-Y' of the program element 7 shown in FIG. 2A. FIG. 2D is a sectional view showing a cross section taken along line Z-Z' of the program element 7 shown in FIG. 2A.

In the present embodiment, a first potential is a power supply potential VDD and a second potential lower than the first potential is a ground potential VSS.

As shown in FIG. 1, the semiconductor integrated circuit 100 includes a voltage supply terminal 1, a first input terminal 2, an output terminal 3, a second input terminal 4, a first MOS transistor 5, a second MOS transistor 6, the program element 7, a latch circuit 8, and a power supply circuit 101. The power supply circuit 101 may be provided outside the semiconductor integrated circuit 100.

The voltage supply terminal 1 is fed with a writing potential VPGM or the power supply potential VDD from the power supply circuit 101. For example, the writing potential VPGM is set higher than the power supply potential VDD.

The first input terminal 2 is fed with a pulse signal which is a first input signal S1 from an external circuit (not shown).

The output terminal 3 is provided for outputting an output signal Sout and is connected to the input of the latch circuit 8.

The second input terminal 4 is fed with a pulse signal which is a second input signal S2 from the external circuit (not shown).

The first MOS transistor 5 is a pMOS transistor in this configuration. The first MOS transistor 5 has one end (source) connected to the voltage supply terminal 1 and the gate electrode connected to the first input terminal 2. The gate electrode of the first MOS transistor 5 includes a polysilicon film formed on a gate insulating film and a silicide film formed on the polysilicon film.

The second MOS transistor 6 is a PMOS transistor. The second MOS transistor 6 has one end (source) connected to the power supply potential VDD which is the first potential, the other end (drain) connected to the output terminal 3, and the gate electrode connected to the second input terminal 4. The gate electrode of the second MOS transistor 6 includes a polysilicon film formed on the gate insulating film and a silicide film formed on the polysilicon film.

As shown in FIGS. 2A to 2D, the program element 7 acts as a MOS transistor (nMOS transistor in this configuration) having one end B (drain 7d) connected to the other end (drain) of the second MOS transistor 6 and the other end C (source 7c) connected to the ground potential VSS which is the second potential.

A gate electrode 7a of the program element (nMOS transistor) 7 has one end A connected to the other end (drain) of the first MOS transistor and the other end C connected to the ground potential VSS.

The gate electrode 7a includes a polysilicon film 7a1 and a silicide film 7a2. The polysilicon film 7a1 is formed on a gate insulating film 7b provided on a semiconductor substrate 7e. The silicide film 7a2 is formed on the polysilicon film 7a1.

The suicide film 7a2 of the gate electrode 7a is designed so as to have a smaller thickness than the silicide films of the gate electrodes of the first MOS transistor 5 and the second MOS transistor 6.

As shown in FIG. 1, the latch circuit 8 latches the potential of the output signal Sout and then outputs the result of latching to a flip-flop circuit F/F for judging data.

Figure 3:
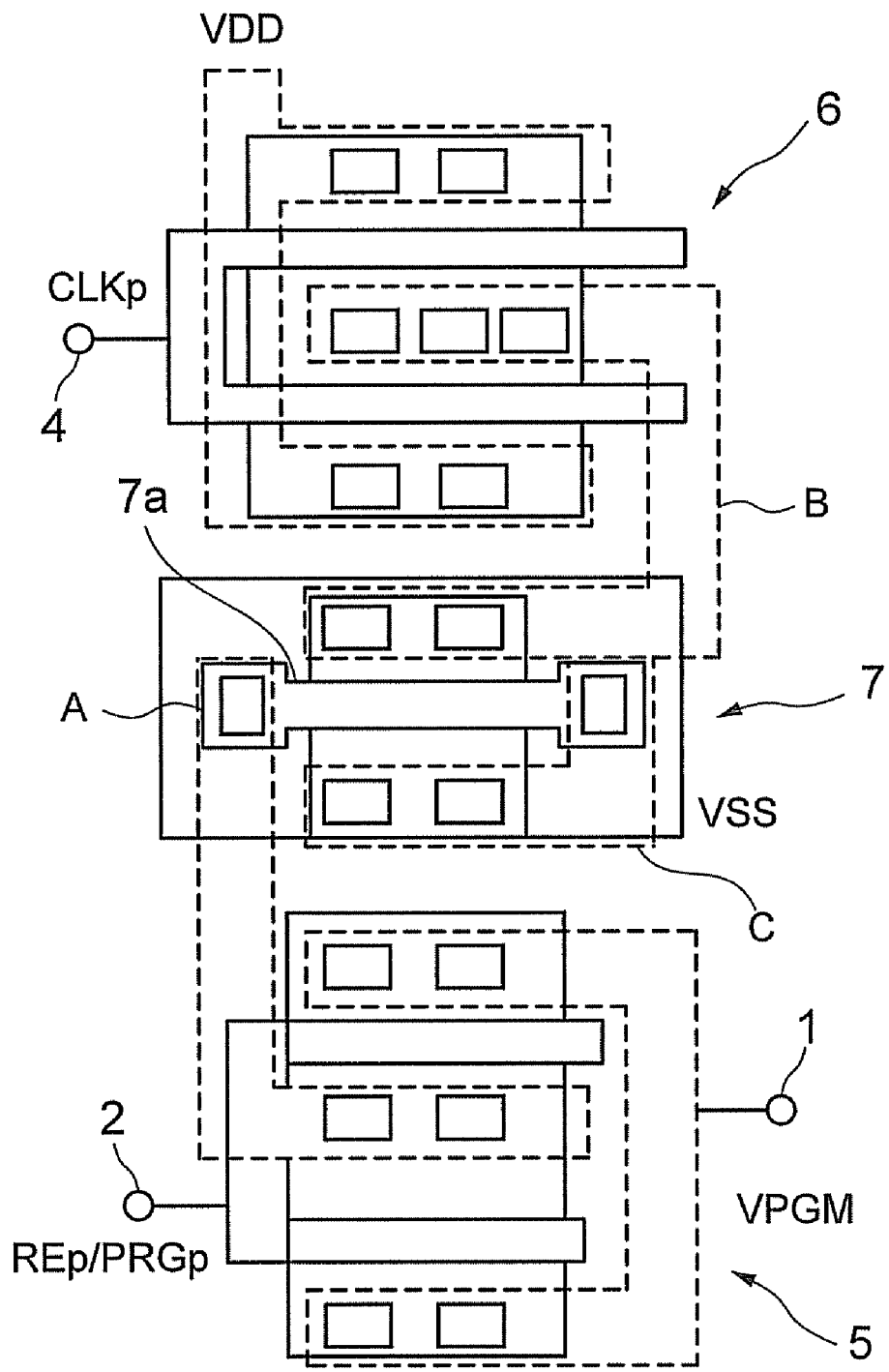
FIG. 3 is a figure showing the layout of the semiconductor integrated circuit 100 shown in FIG. 1.

FIG. 3 shows the layout of the semiconductor integrated circuit 100 shown in FIG. 1. In FIG. 3, the latch circuit 8 and the like are omitted for simplification.

As shown in FIG. 3, the gate electrode of the MOS transistor is caused to act as an element to be programmed. Thus it is possible to improve area efficiency and the degree of integration of the circuit as compared with the prior art.

The following will describe the operations of the semiconductor integrated circuit 100 configured thus.

First, a writing mode for writing data into the program element 7 will be discussed below.

Figure 4:
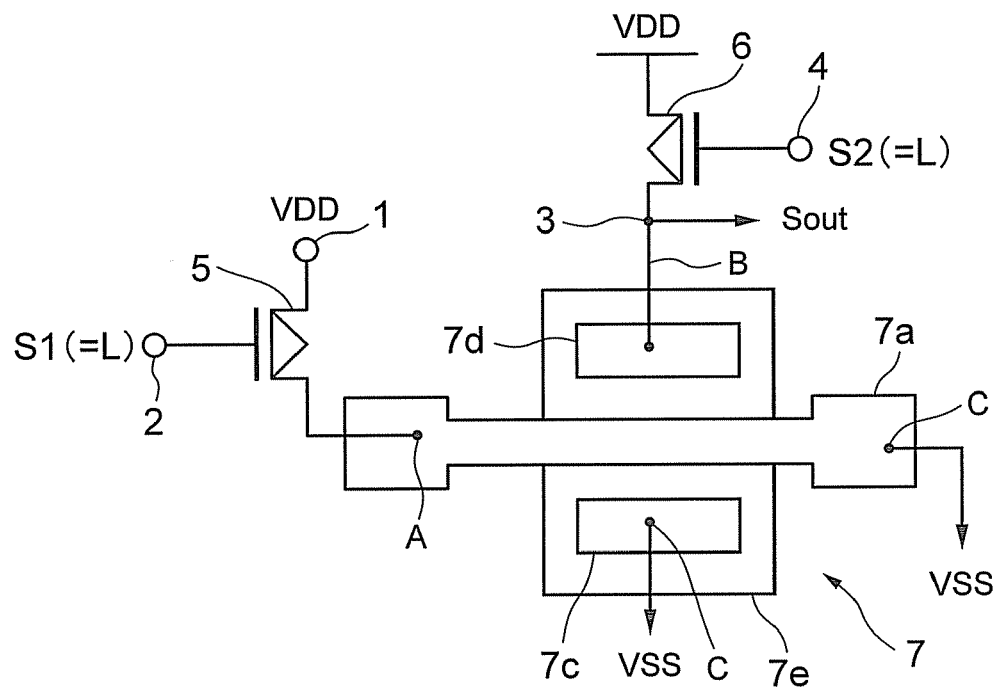
FIG. 4 is a figure showing a state in which data has not been written into the program element in the writing mode.
Figure 5:
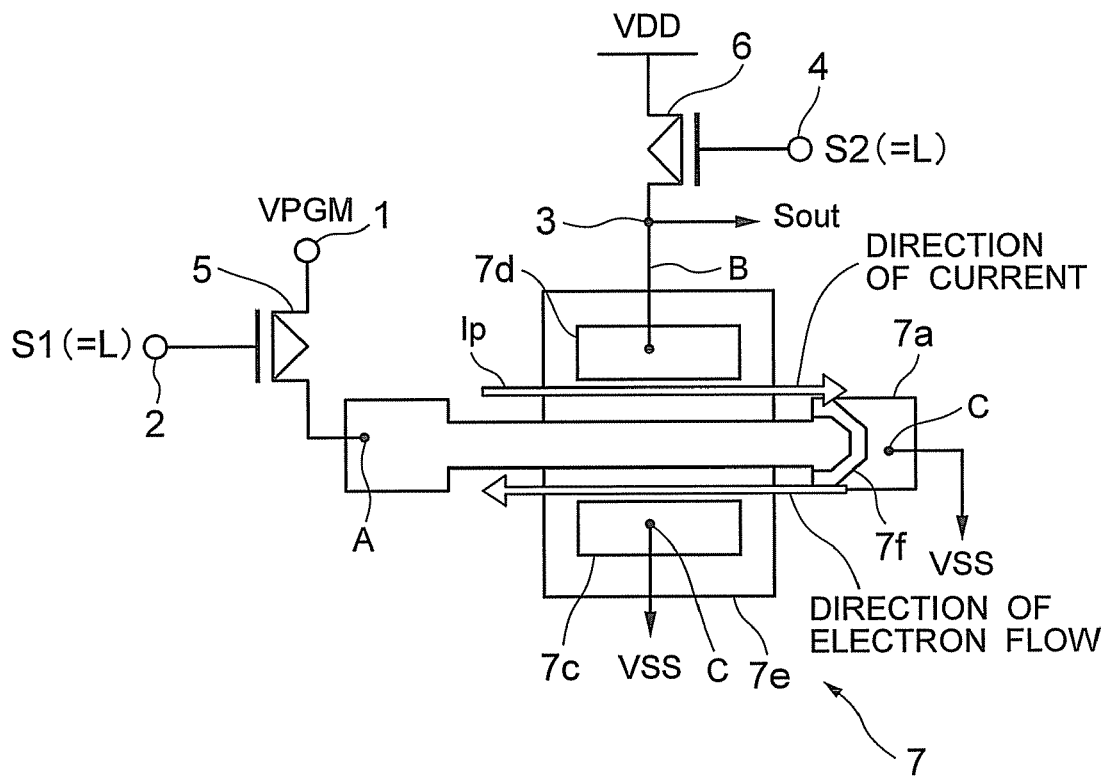
FIG. 5 is a figure showing a state in which data has been written into the program element in the writing mode.
Figure 6A:
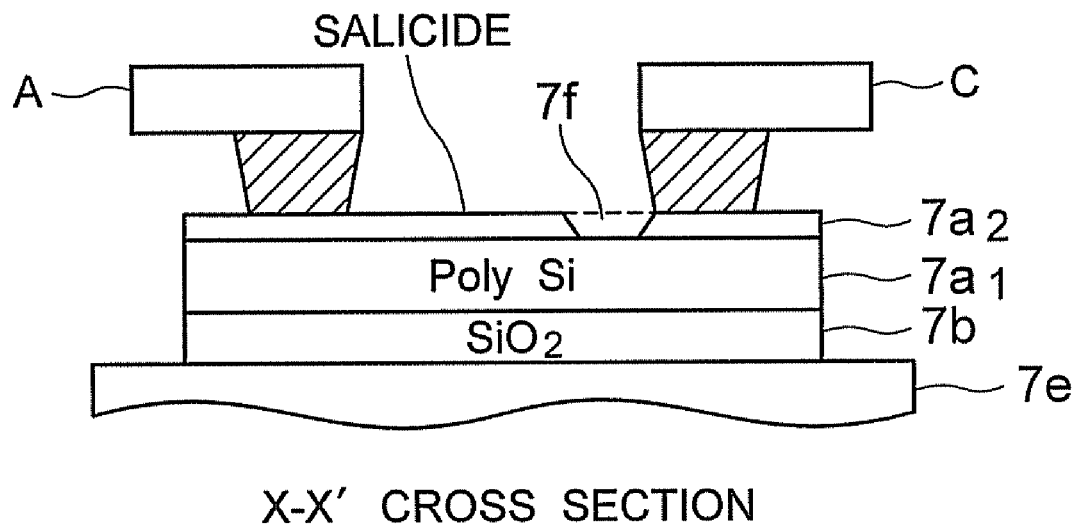
FIG. 6A is a sectional view showing a cross section taken along line X-X' of the program element 7 of FIG. 2A in a state in which data has been written into the program element 7.
Figure 6B:
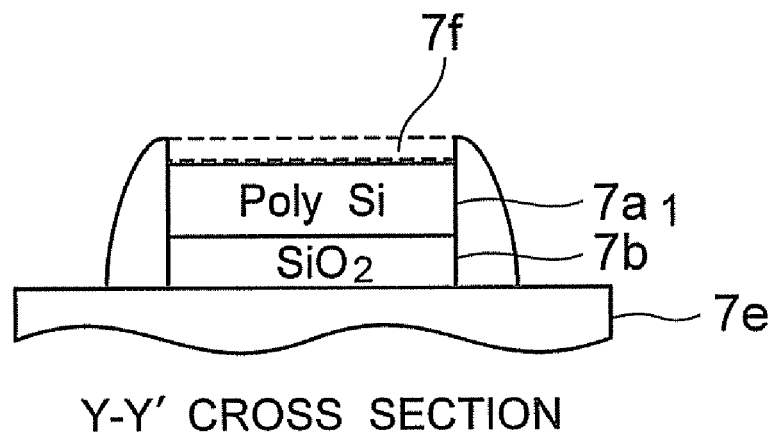
FIG. 6B is a sectional view showing a cross section taken along line Y-Y' of the program element 7 of FIG. 2A in a state in which data has been written into the program element 7.

FIG. 4 shows a state in which data has not been written into the program element in the writing mode. FIG. 5 shows a state in which data has been written into the program element in the writing mode. FIG. 6A is a sectional view showing a cross section taken along line X-X' of the program element 7 of FIG. 2A in a state in which data has been written into the program element 7. FIG. 6B is a sectional view showing a cross section taken along line Y-Y' of the program element 7 of FIG. 2A in a state in which data has been written into the program element 7.

As shown in FIG. 4, first, the input signal S1 is set at "Low" level to turn on the first MOS transistor 5.

After that, as shown in FIG. 5, the power supply circuit 101 sets the potential of the voltage supply terminal 1 at the positive writing potential VPGM, so that the program element 7 is fed with a writing current Ip. Thus electro migration occurs on the gate electrode 7a. The electro migration forms a high resistance area 7f on a portion where the gate electrode 7a rapidly increases in width from a thin portion (FIGS. 6A and 6B). This is because kinetic energy generated by the passage of electrons is transmitted through collision with metal particles forming the silicide film 7a2 and the kinetic energy moves silicide.

In other words, the potential of the voltage supply terminal 1 is set at the positive writing potential VPGM and the first MOS transistor 5 is turned on for a predetermined period by the first input signal St, so that electro migration is caused to occur on the silicide film 7a2. Thus the high resistance area 7f is formed on the gate electrode 7a.

In the writing mode, when the first MOS transistor 5 is turned on, the writing potential VPGM is set such that a potential difference between the gate electrode 7a of the program element 7 and diffusion layers (source, drain) 7c and 7d does not exceed the dielectric strength voltage of the gate insulating film 7b.

For example, the input signal S2 is set at "Low" level to turn on the second MOS transistor 6 and the potential of the source 7d is increased. Thus the potential difference can be reduced.

Next, a reading mode for reading data stored in the program element 7 will be discussed.

Figure 7:
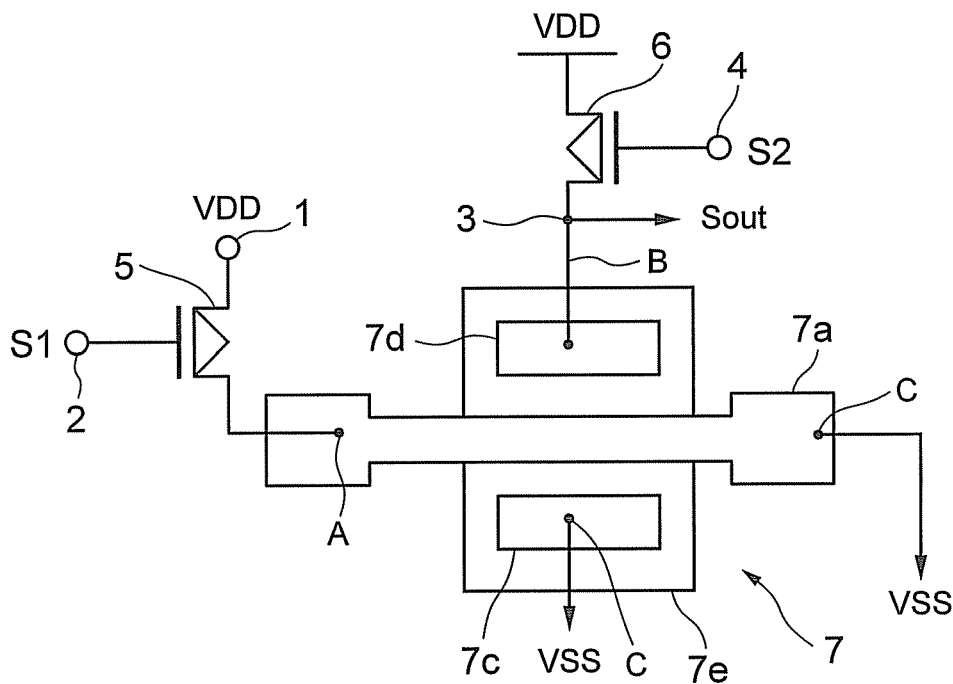
FIG. 7 is a figure showing a state in which a reading voltage is applied to the program element where data has not been written in the reading mode.
Figure 8:
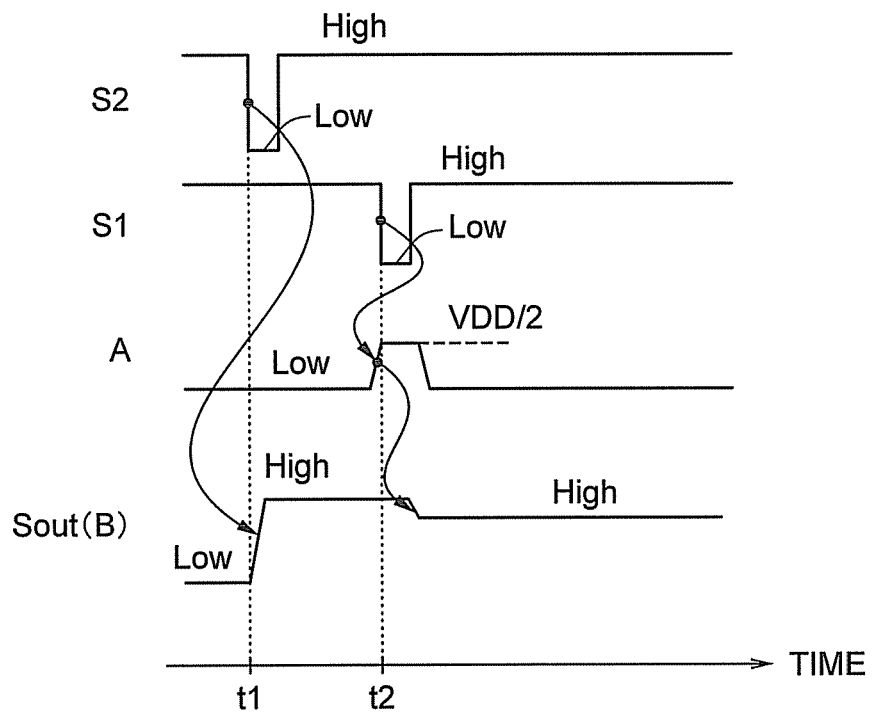
FIG. 8 is a timing chart showing the signal waveforms of the reading mode during reading on the program element where data has not been written.

FIG. 7 shows a state in which a reading voltage is applied to the program element where data has not been written in the reading mode. FIG. 8 is a timing chart showing the signal waveforms of the reading mode during reading on the program element where data has not been written.

As shown in FIG. 7, in the reading mode, the power supply circuit 101 sets the potential of the voltage supply terminal 1 at a positive reading potential (in this case, the power supply potential VDD) lower than the writing potential VPGM. Further, as shown in FIG. 7, the high resistance area 7f is not formed on the gate electrode 7a.

In this state, as shown in FIG. 8, the second input signal S2 is first set at "Low" level for a predetermined period, so that the second MOS transistor 6 is turned on for the predetermined period (time t1). At this point, the first input signal S1 is kept at "High" level and the nMOS transistor made up of the program element 7 is turned off. Thus the potential of the output signal Sout changes from "Low" level to "High" level. In other words, the terminal B is precharged to "High" level.

After that, the first input signal S1 is set at "Low" level for a predetermined period, so that the first MOS transistor 5 is turned on for the predetermined period (time t2). Thus the terminal A is charged to a potential (e.g., VDD/2) obtained by dividing the power supply potential VDD by the first MOS transistor 5 and the gate electrode 7a.

However, when the first input signal S1 returns to "High" level, a charge having been applied to the terminal A is discharged through the gate electrode 7a. In other words, the potential of the terminal A quickly returns to "Low" level. Thus the nMOS transistor acting as the program element 7 is kept turned off.

Thus the potential of the output signal Sout is kept at "High" level.

Figure 9:
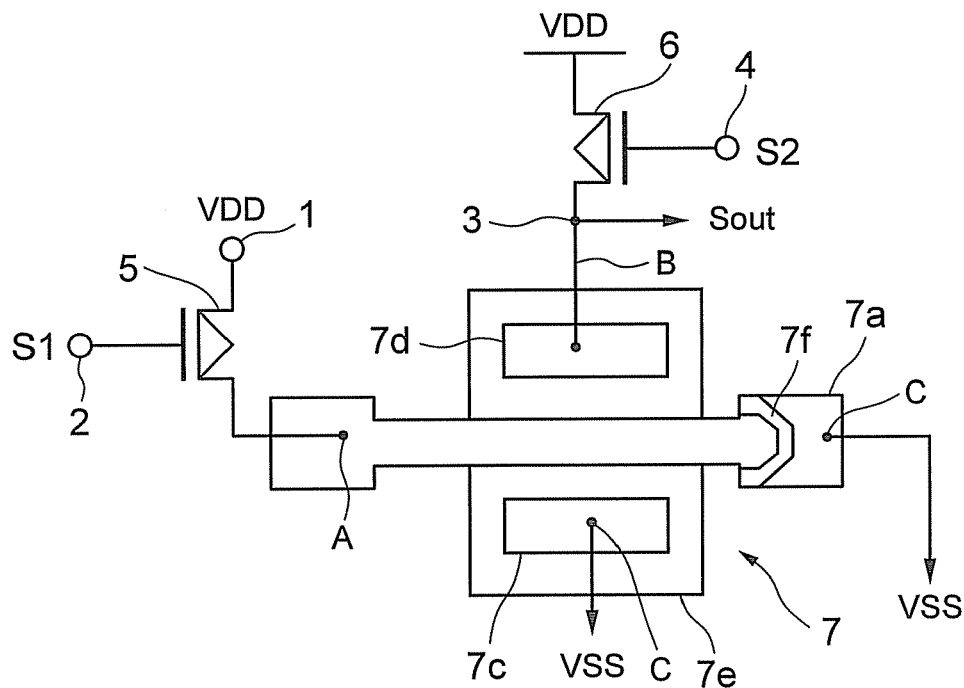
FIG. 9 is a figure showing a state in which a reading voltage is applied to the program element where data has been written in the reading mode.
Figure 10:
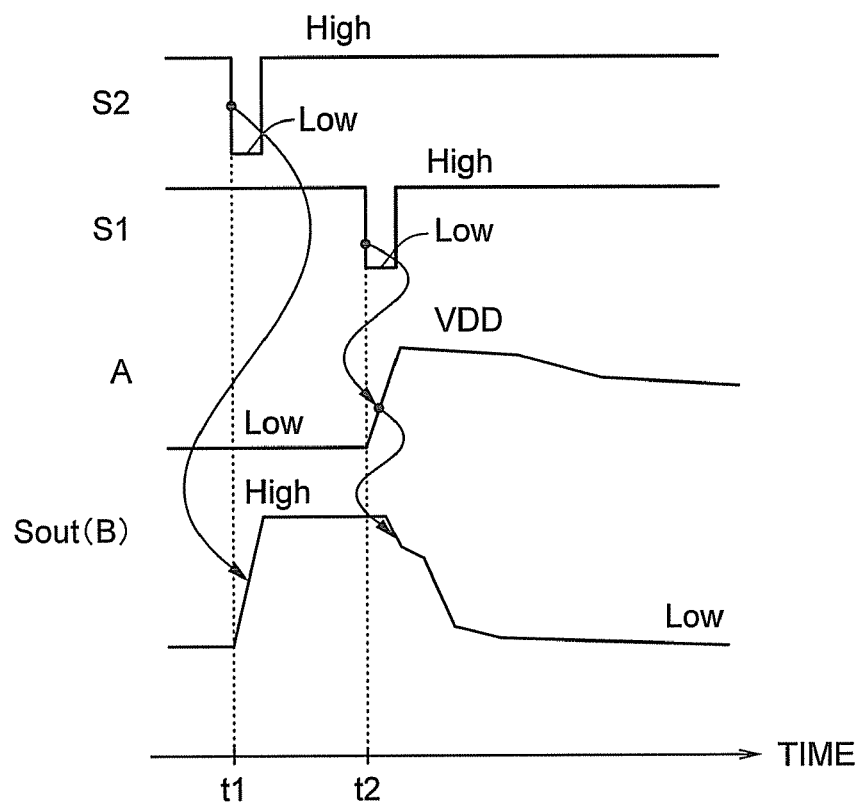
FIG. 10 is a timing chart showing the signal waveforms of the reading mode during reading on the program element where data has been written.

FIG. 9 shows a state in which a reading voltage is applied to the program element where data has been written in the reading mode. FIG. 10 is a timing chart showing the signal waveforms of the reading mode during reading on the program element where data has been written.

As shown in FIG. 9, as has been discussed, the power supply circuit 101 sets the potential of the voltage supply terminal 1 at the positive reading potential (in this case, the power supply potential VDD) lower than the writing potential VPGM in the reading mode. Further, as shown in FIG. 9, data has been written into the program element 7 and the high resistance area 7f is formed on the gate electrode 7a.

In this state, as shown in FIG. 10, the second input signal S2 is first set at "Low" level for a predetermined period, so that the second MOS transistor 6 is turned on for the predetermined period (time t1). At this point, the first input signal S1 is kept at "High" level and the nMOS transistor made up of the program element 7 is turned off. Thus the potential of the output signal Sout changes from "Low" level to "High" level. In other words, the terminal B is precharged to "High" level.

After that, the first input signal S1 is set at "Low" level for a predetermined period, so that the first MOS transistor 5 is turned on for the predetermined period (time t2). As described above, the high resistance area 7f is formed on the gate electrode 7a and thus the terminal A is charged to a potential (for example, close to the power supply potential VDD) obtained by dividing the power supply potential VDD by the first MOS transistor 5 and the gate electrode 7a having a high resistance.

Even when the first input signal S1 returns to "High" level, a charge having been applied to the terminal A is not immediately discharged because the gate electrode 7a has a high resistance. In other words, the potential of the terminal A is kept at "High" level, so that the nMOS transistor acting as the program element 7 is turned on. Thus the terminal B is discharged to "Low" level.

Therefore, the potential of the output signal Sout changes from "High" level to "Low" level.

As described above, in the reading mode, the potential of the voltage supply terminal 1 is set at the positive reading potential lower than the writing potential, and the second MOS transistor 6 is turned on for the predetermined period by the second input signal S2. After that, the first MOS transistor 5 is turned on for the predetermined period by the first input signal S1.

The potential of the output signal Sout outputted from the output terminal 3 is latched by the latch circuit 8 and the result of latching is recognized by, for example, a flip-flop circuit and the like. Thus it is possible to determine whether data has been written into the program element 7.

As has been discussed, in the present embodiment, the gate electrode of the MOS transistor is caused to act as an element to be programmed. Thus it is possible to improve area efficiency and the degree of integration of the circuit as compared with the prior art.

As described above, the semiconductor integrated circuit of the present embodiment can improve the degree of integration of the circuit.

Second Embodiment

The first embodiment described a configuration example in which the gate electrode of the nMOS transistor is caused to act as an element to be programmed.

A second embodiment will describe a configuration example in which the gate electrode of a pMOS transistor is caused to act as an element to be programmed.

Figure 11:
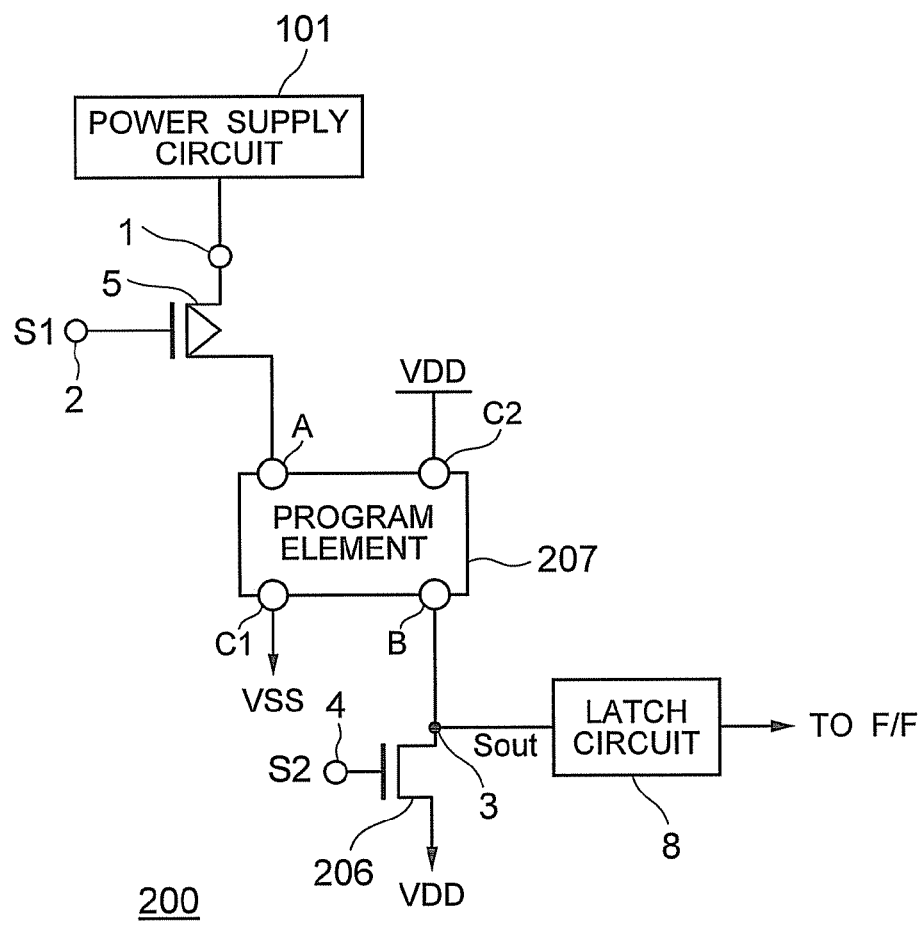
FIG. 11 is a figure showing the configuration of the main part of a semiconductor integrated circuit 200 according to the second embodiment which is an aspect of the present invention.
Figure 12A:
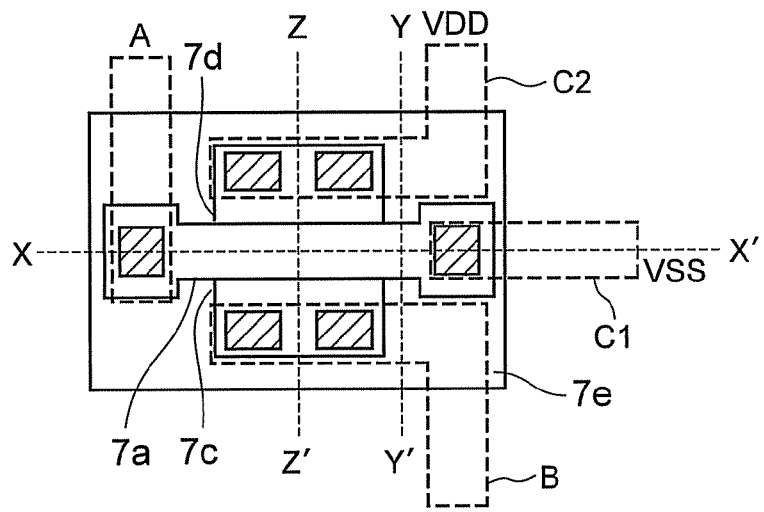
FIG. 12A is a figure showing an example of the layout of a program element 207 shown in FIG. 11.
Figure 12B:
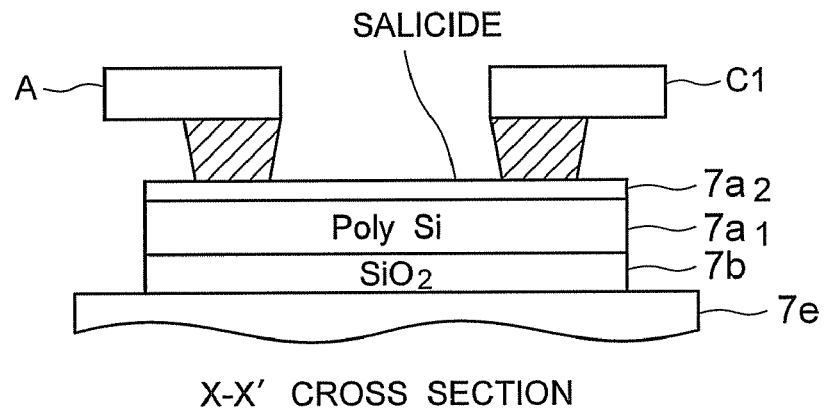
FIG. 12B is a sectional view showing a cross section taken along line X-X' of the program element 207 shown in FIG. 12A.
Figure 12C:
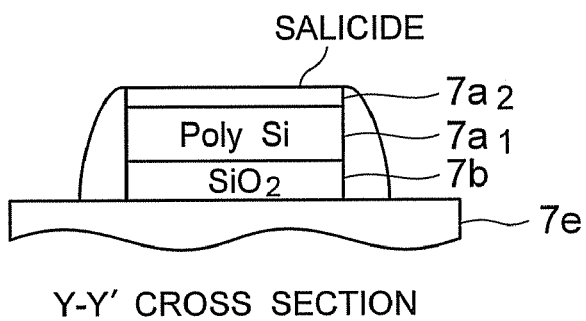
FIG. 12C is a sectional view showing a cross section taken along line Y-Y' of the program element 207 shown in FIG. 12A.
Figure 12D:
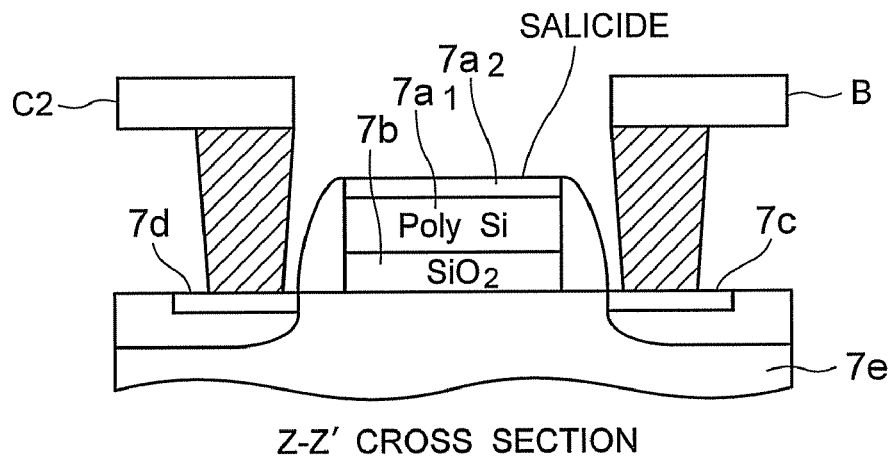
FIG. 12D is a sectional view showing a cross section taken along line Z-Z' of the program element 207 shown in FIG. 12A.

FIG. 11 shows the configuration of the main part of a semiconductor integrated circuit 200 according to the second embodiment which is an aspect of the present invention. FIG. 12A shows an example of the layout of a program element 207 shown in FIG. 11. FIG. 12B is a sectional view showing a cross section taken along line X-X' of the program element 207 shown in FIG. 12A. FIG. 12C is a sectional view showing a cross section taken along line Y-Y' of the program element 207 shown in FIG. 12A. FIG. 12D is a sectional view showing a cross section taken along line Z-Z' of the program element 207 shown in FIG. 12A.

In the present embodiment, a first potential is a ground potential VSS and a second potential higher than the first potential is a power supply potential VDD.

As shown in FIG. 11, the semiconductor integrated circuit 200 includes a voltage supply terminal 1, a first input terminal 2, an output terminal 3, a second input terminal 4, a first MOS transistor 5, a second MOS transistor 206, the program element 207, a latch circuit 8, and a power supply circuit 101. The power supply circuit 101 may be provided outside the semiconductor integrated circuit 200. In other words, the semiconductor integrated circuit 200 is configured as the semiconductor integrated circuit 100 of the first embodiment except for the second MOS transistor 206 and the program element 207.

The voltage supply terminal 1 is fed with a writing potential VPGM or the power supply potential VDD from the power supply circuit 101. For example, the writing potential VPGM is set higher than the power supply potential VDD.

The first input terminal 2 is fed with a pulse signal which is a first input signal S1 from an external circuit (not shown).

The output terminal 3 is provided for outputting an output signal Sout and is connected to the input of the latch circuit 8.

The second input terminal 4 is fed with a pulse signal which is a second input signal S2 from the external circuit (not shown).

The first MOS transistor 5 is a PMOS transistor in this configuration. The first MOS transistor 5 has one end (source) connected to the voltage supply terminal 1 and the gate electrode connected to the first input terminal 2. The gate electrode of the first MOS transistor 5 includes a polysilicon film formed on a gate insulating film and a silicide film formed on the polysilicon film.

The second MOS transistor 206 is an nMOS transistor in this configuration. The second MOS transistor 206 has one end (source) connected to the ground potential VSS which is the first potential, the other end (drain) connected to the output terminal 3, and the gate electrode connected to the second input terminal 4. The gate electrode of the second MOS transistor 206 includes a polysilicon film formed on the gate insulating film and a silicide film formed on the polysilicon film.

As shown in FIGS. 12A to 12D, the program element 207 acts as a MOS transistor (pMOS transistor in this configuration) having one end B (drain 7d) connected to the other end (drain) of the second MOS transistor 206 and the other end C (source 7c) connected to the power supply potential VDD which is the second potential.

A gate electrode 7a of the program element (nMOS transistor) 207 has one end A connected to the other end (drain) of the first MOS transistor and the other end C1 connected to the ground potential VSS.

The gate electrode 7a includes a polysilicon film 7a1 and a suicide film 7a2 as in the first embodiment. The polysilicon film 7a1 is formed on a gate insulating film 7b provided on a semiconductor substrate 7e. The silicide film 7a2 is formed on the polysilicon film 7a1.

As in the first embodiment, the silicide film 7a2 of the gate electrode 7a is designed so as to have a smaller thickness than the silicide films of the gate electrodes of the first MOS transistor 5 and the second MOS transistor 206.

As shown in FIG. 11, the latch circuit 8 latches the potential of the output signal Sout as in the first embodiment, and outputs the result of latching to a flip-flop circuit F/F for judging data.

Also in the present embodiment, the gate electrode of the MOS transistor is caused to act as an element to be programmed. Thus it is possible to improve area efficiency and the degree of integration of the circuit as compared with the prior art.

The following will describe the operations of the semiconductor integrated circuit 200 configured thus.

First, a writing mode for writing data into the program element 207 will be discussed below.

Figure 13:
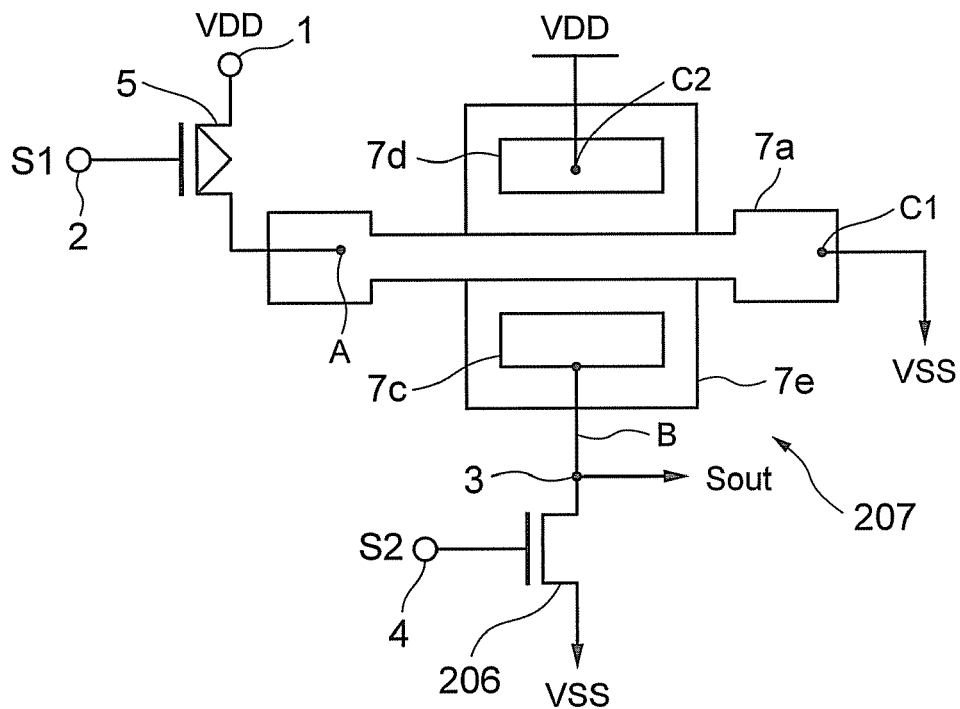
FIG. 13 is figure showing a state in which data has not been written into the program element in the writing mode.
Figure 14:
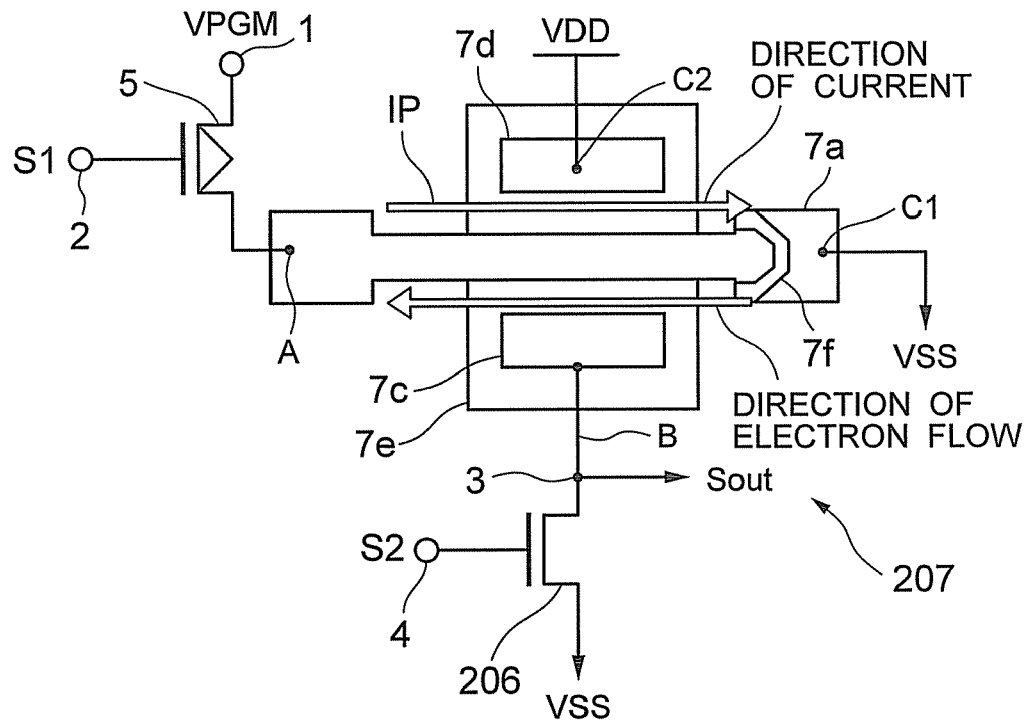
FIG. 14 is a figure showing a state in which data has been written into the program element in the writing mode.

FIG. 13 shows a state in which data has not been written into the program element in the writing mode. FIG. 14 shows a state in which data has been written into the program element in the writing mode.

As shown in FIG. 13, first, the input signal S1 is set at "Low" level to turn on the first MOS transistor 5.

After that, as shown in FIG. 14, the power supply circuit 101 sets the potential of the voltage supply terminal 1 at the positive writing potential VPGM, so that the program element 207 is fed with a writing current Ip. Thus electro migration occurs on the gate electrode 7a. As in the first embodiment, the electro migration forms a high resistance area 7f on a portion where the gate electrode 7a rapidly increases in width from a thin portion.

In other words, the potential of the voltage supply terminal 1 is set at the positive writing potential VPGM and the first MOS transistor 5 is turned on for a predetermined period by the first input signal S1, so that electro migration is caused to occur on the silicide film 7a2. Thus the high resistance area 7f is formed on the gate electrode 7a.

In the writing mode, when the first MOS transistor 5 is turned on, the writing potential VPGM is set such that a potential difference between the gate electrode 7a of the program element 207 and diffusion layers (source, drain) 7c and 7d does not exceed the dielectric strength voltage of the gate insulating film 7b.

For example, the input signal S2 is set at "High" level to turn on the second MOS transistor 206 and the potential of the source 7d is increased. Thus the potential difference can be reduced.

Next, a reading mode for reading data stored in the program element 207 will be discussed.

Figure 15:
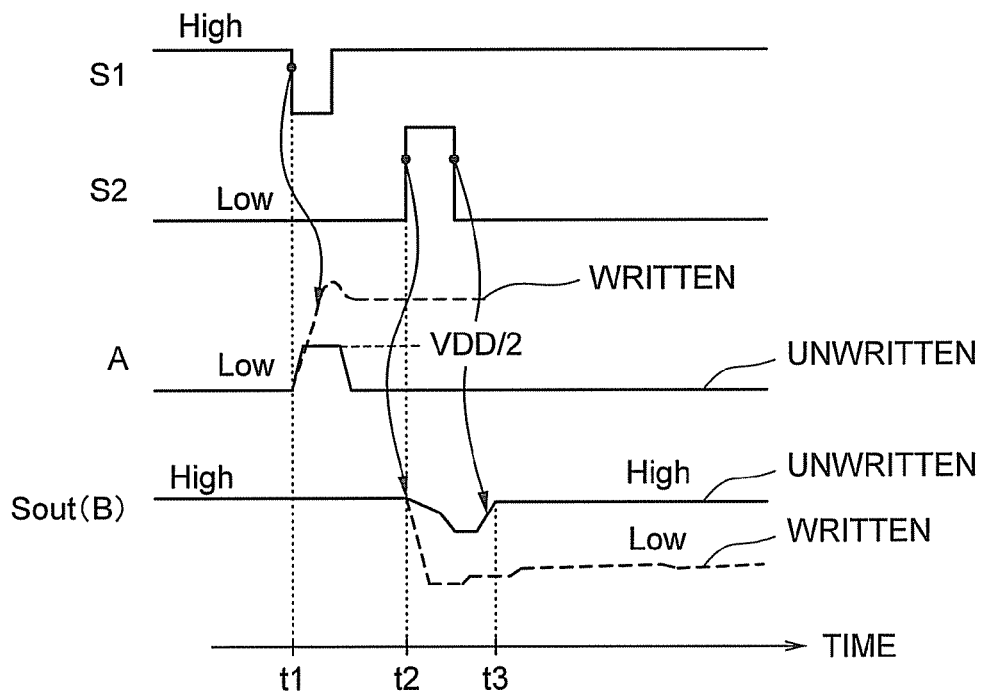
FIG. 15 is a timing chart showing the signal waveforms of the reading mode during reading on the program element where data has not been written and reading on the program element where data has been written.

FIG. 15 is a timing chart showing the signal waveforms of the reading mode during reading on the program element where data has not been written and reading on the program element where data has been written.

As shown in FIG. 15, the first input signal S1 is first set at "Low" level for a predetermined period, so that the first MOS transistor 5 is turned on for the predetermined period (time t1). At this point, the second input signal S2 is kept at "Low" level, so that the second MOS transistor 206 is kept turned off.

Thus when data has not been written into the program element 207, the terminal A is charged to a potential (e.g., VDD/2) obtained by dividing the power supply potential VDD by the first MOS transistor 5 and the gate electrode 7a. However, when the potential of the first input signal S1 returns to "High" level, a charge is discharged from the gate electrode 7a, so that the potential of the terminal A returns to "Low" level. Thus the PMOS transistor made up of the program element 207 is turned on.

When data has been written into the program element 207, the high resistance area 7f is formed on the gate electrode 7a. Thus the terminal A is charged to a potential (for example, close to the power supply potential VDD) obtained by dividing the power supply potential VDD by the first MOS transistor 5 and the gate electrode 7a having a high resistance. Even when the first input signal S1 returns to "High" level, the charge having been applied to the gate electrode 7a is slowly discharged, the PMOS transistor made up of the program element 207 is kept turned off.

After that, in this state, the second input signal S2 is set at "High" level for a predetermined period, so that the second MOS transistor 206 is turned on for the predetermined period (time t2).

Thus when data has not been written into the program element 207, the PMOS transistor made up of the program element 207 is turned on, so that the potential of the output signal Sout is kept at "High" level.

When data has been written into the program element 207, the pMOS transistor made up of the program element 207 is turned off, so that the potential of the output signal Sout changes from "High" level to "Low" level. In other words, the terminal B is discharged to "Low" level.

As described above, in the reading mode, the potential of the voltage supply terminal 1 is set at a positive reading potential lower than the writing potential and the first MOS transistor 5 is turned on for a predetermined period by the first input signal S1. After that, the second MOS transistor 206 is turned on for the predetermined period by the second input signal S2.

The potential of the output signal Sout outputted from the output terminal 3 is latched by the latch circuit 8 and the result of latching is recognized by, for example, a flip-flop circuit and the like. Thus it is possible to determine whether data has been written into the program element 207.

As has been discussed, in the present embodiment, the gate electrode of the MOS transistor is caused to act as an element to be programmed. Thus it is possible to improve area efficiency and the degree of integration of the circuit as compared with the prior art.

As described above, the semiconductor integrated circuit of the present embodiment can improve the degree of integration of the circuit.

Third Embodiment

In a third embodiment, a capacitor is further connected between the junction of a program element and a first MOS transistor and the ground, unlike in the configuration of the semiconductor integrated circuit of the first embodiment. The following will describe a configuration example for improving the reading margin of an output signal. Also in the configuration of the semiconductor integrated circuit according to the second embodiment, the same effect can be achieved by further connecting a capacitor between the junction of the program element and the first MOS transistor and the ground.

Figure 16:
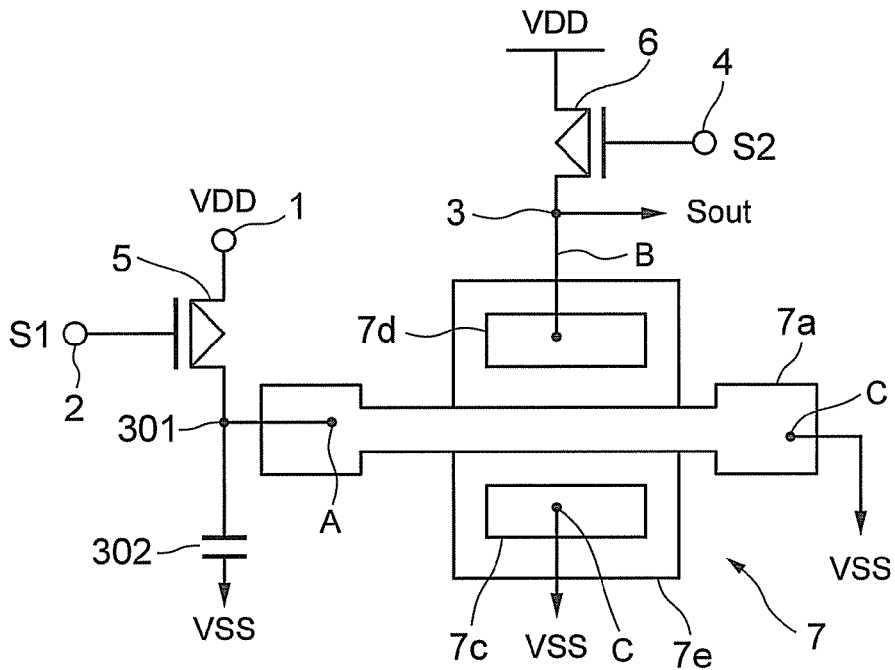
FIG. 16 is figure showing the configuration of the main part of a semiconductor integrated circuit 300 according to the third embodiment which is an aspect of the present invention.

FIG. 16 shows the configuration of the main part of a semiconductor integrated circuit 300 according to the third embodiment which is an aspect of the present invention. In FIG. 16, a power supply circuit, a latch circuit, and the like are omitted for simplification. In FIG. 16, the semiconductor integrated circuit 300 is in a reading mode.

As shown in FIG. 16, in the semiconductor integrated circuit 300, a capacitor 302 is connected between ground VSS and a junction 301 (terminal A) of a gate electrode 7a of a program element 7 and a first MOS transistor 5, unlike in the semiconductor integrated circuit 100 of the first embodiment. Other configurations of the semiconductor integrated circuit 300 are similar to the configurations of the semiconductor integrated circuit 100 of the first embodiment as has been discussed.

FIG. 16 shows a state in which a reading voltage is applied to the program element where data has not been written in the reading mode as has been discussed.

As shown in FIG. 16, in the reading mode, the power supply circuit sets the potential of a voltage supply terminal 1 at a positive reading potential (in this case, a power supply potential VDD) lower than a writing potential VPGM. Further, as shown in FIG. 16, a high resistance area 7f is not formed on a gate electrode 7a.

Next, the reading mode for reading data stored in the program element 7 will be discussed.

Figure 17:
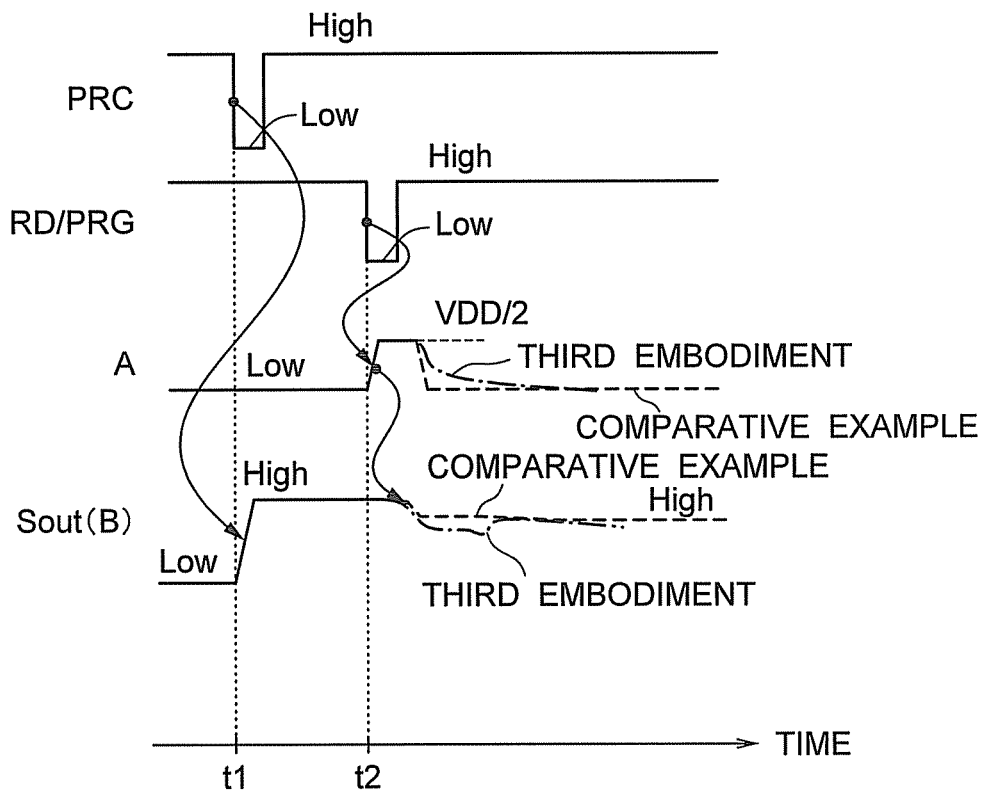
FIG. 17 is a timing chart showing the signal waveforms of the reading mode during reading on the program element where data has not been written.

FIG. 17 is a timing chart showing the signal waveforms of the reading mode during reading on the program element where data has not been written. Further, in FIG. 17, the waveforms of a comparative example of the capacitor on the junction 301 are indicated by dotted lines for comparison.

In the state of FIG. 16, as shown in FIG. 17, a second input signal S2 is first set at "Low" level for a predetermined period as in the first embodiment, so that a second MOS transistor 6 is turned on for the predetermined period (time t1). At this point, a first input signal S1 is kept at "High" level and an nMOS transistor made up of the program element 7 is turned off. Thus the potential of an output signal Sout changes from "Low" level to "High" level. In other words, a terminal B is precharged to "High" level.

After that, the first input signal S1 is set at "Low" level for a predetermined period, so that the first MOS transistor 5 is turned on for the predetermined period (time t2). Thus the terminal A is charged to a potential (e.g., VDD/2) obtained by dividing the power supply potential VDD by the first MOS transistor 5 and the gate electrode 7a.

However, when the first input signal S1 returns to "High" level, a charge having been applied to the terminal A is discharged through the gate electrode 7a. In other words, the potential of the terminal A quickly returns to "Low" level. Thus the nMOS transistor acting as the program element 7 is kept turned off.

Thus the potential of the output signal Sout is kept at "High" level.

In this case, data has not been written into the program element 7, so that in the comparative example where the capacitor is not connected to the junction 301, the terminal A is quickly discharged from time t2. Consequently, it is considered that a higher potential is kept in the comparative example than in the third embodiment. However, in the semiconductor integrated circuit 300 of the third embodiment, the gate electrode 7a has a low resistance when data has not been written into the program element 7, so that it is considered that a "0" (unwritten) reading margin hardly deteriorates.

Figure 18:
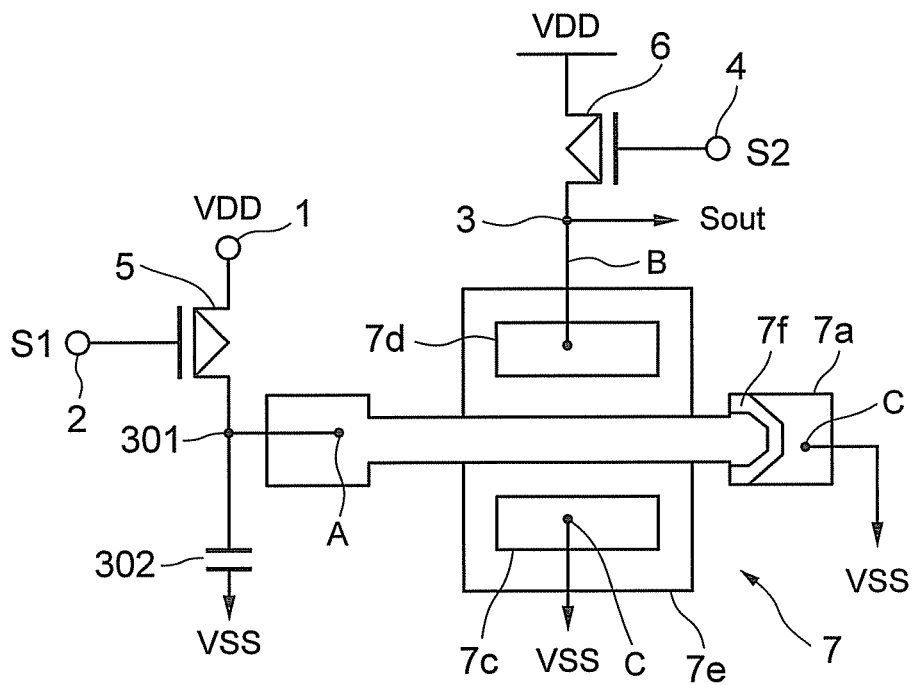
FIG. 18 is a figure showing a state in which a reading voltage is applied to the program element where data has been written in the reading mode.
Figure 19:
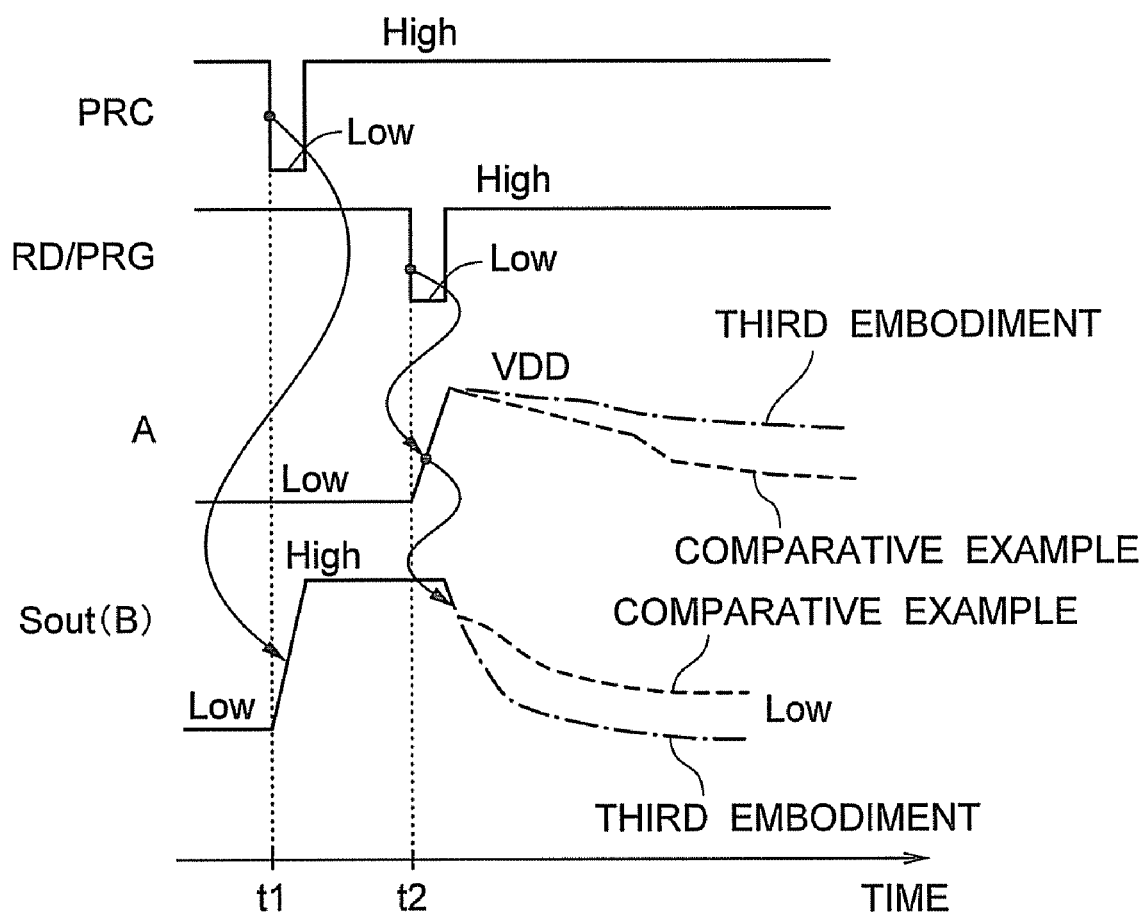
FIG. 19 is a timing chart showing the signal waveforms of the reading mode during reading on the program element where data has been written.

FIG. 18 shows a state in which a reading voltage is applied to the program element where data has been written in the reading mode. FIG. 19 is a timing chart showing the signal waveforms of the reading mode during reading on the program element where data has been written.

As shown in FIG. 18, as has been discussed, the power supply circuit sets the potential of the voltage supply terminal 1 at the positive reading potential (in this case, the power supply potential VDD) lower than the writing potential VPGM in the reading mode. Further, as shown in FIG. 19, data has been written into the program element 7 and the high resistance area 7f is formed on the gate electrode 7a.

In this state, as shown in FIG. 18, a second input signal S2 is first set at "Low" level for a predetermined period as in the first embodiment, so that the second MOS transistor 6 is turned on for the predetermined period (time t1). At this point, the first input signal S1 is kept at "High" level and the nMOS transistor made up of the program element 7 is turned off. Thus the potential of the output signal Sout changes from "Low" level to "High" level. In other words, the terminal B is precharged to "High" level.

After that, the first input signal S1 is set at "Low" level for a predetermined period, so that the first MOS transistor 5 is turned on for the predetermined period (time t2). As described above, the high resistance area 7f is formed on the gate electrode 7a. Thus the terminal A is charged to a potential (for example, close to the power supply potential VDD) obtained by dividing the power supply potential VDD by the first MOS transistor 5 and the gate electrode 7a having a high resistance.

Even when the first input signal S1 returns to "High" level, a charge having been applied to the terminal A is not immediately discharged because the gate electrode 7a has a high resistance. In other words, the potential of the terminal A is kept at "High" level, so that the nMOS transistor acting as the program element 7 is turned on. Thus the terminal B is discharged to "Low" level.

When the resistance value of the gate electrode 7a does not increase as expected after writing (electro migration), a discharge rate increases from time t2 in the comparative example where the capacitor is not added. Consequently, it is considered difficult to set the potential of the output signal Sout (terminal B) at "Low" level.

The semiconductor integrated circuit 300 of the third embodiment has a lower discharge rate than in the comparative example because the capacitor 302 is connected to the junction 301 (terminal A). Consequently, it is possible to accelerate the reduction in the potential of the output signal Sout (terminal B) to "Low" level, so that a "1" (written) reading margin can be kept.

Thus in the semiconductor integrated circuit 300 of the third embodiment, the potential of the output signal Sout can be more positively changed from "High" level to "Low" level.

As in the first embodiment, in the reading mode, the potential of the voltage supply terminal 1 is set at the positive reading potential lower than the writing potential and the second MOS transistor 6 is turned on for the predetermined period by the second input signal S2. After that, the first MOS transistor 5 is turned on for the predetermined period by the first input signal S1.

The potential of the output signal Sout outputted from the output terminal 3 is latched by the latch circuit 8 and the result of latching is recognized by, for example, a flip-flop circuit and the like. Thus it is possible to determine whether data has been written into the program element 7.

As has been discussed, in the present embodiment, the gate electrode of the MOS transistor is caused to act as an element to be programmed. Thus it is possible to improve area efficiency and the degree of integration of the circuit as compared with the prior art.

As described above, when the resistance value of the gate electrode 7a cannot be increased as expected after writing (electro migration), the "1" reading margin can be kept.

Further, as in the first embodiment, the semiconductor integrated circuit of the third embodiment can improve the degree of integration of the circuit.

What is claimed is:

1. A semiconductor integrated circuit, comprising:
 a voltage supply terminal;
 a first input terminal fed with a first input signal;
 an output terminal that outputs an output signal;
 a second input terminal fed with a second input signal;
 a first MOS transistor having one end connected to the voltage supply terminal and a gate electrode connected to the first input terminal;
 a second MOS transistor having one end connected to a first potential, an other end connected to the output terminal, and a gate electrode connected to the second input terminal; and
 a program element acting as a MOS transistor having one end connected to the other end of the second MOS transistor and an other end connected to a second potential higher than the first potential,
 wherein the program element includes a gate electrode having one end connected to an other end of the first MOS transistor and an other end connected to a ground potential and including a polysilicon film formed on a gate insulating film and a silicide film formed on the polysilicon film,
 in a writing mode for writing data into the program element,
 the voltage supply terminal has a potential set at a positive writing potential and the first MOS transistor is turned on for a predetermined period by the first input signal, so that electro migration is caused to occur on the silicide film, and in a reading mode for reading data stored in the program element, the voltage supply terminal has a potential set at a positive reading potential lower than the writing potential, the first MOS transistor is turned on for a predetermined period by the first input signal, and then the second MOS transistor is turned on for a predetermined period by the second input signal.

2. The semiconductor integrated circuit according to claim 1, wherein the gate electrodes of the first MOS transistor and the second MOS transistor each include the polysilicon film formed on the gate insulating film and the silicide film formed on the polysilicon film, and the silicide film of the gate electrode of the program element has a smaller thickness than the silicide films of the gate electrodes of the first MOS transistor and the second MOS transistor.

3. The semiconductor integrated circuit according to claim 2, wherein when the first MOS transistor is turned on in the writing mode, the writing potential is set such that a potential difference between the gate electrode of the program element and a diffusion layer of the program element does not exceed a dielectric strength voltage of the gate insulating film of the program element.

4. The semiconductor integrated circuit according to claim 3 further comprising a capacitor connected between a junction of the gate electrode of the program element and the first MOS transistor and the ground potential.

5. The semiconductor integrated circuit according to claim 2, further comprising a capacitor connected between a junction of the gate electrode of the program element and the first MOS transistor and the ground potential.

6. The semiconductor integrated circuit according to claim 1, wherein when the first MOS transistor is turned on in the writing mode, the writing potential is set such that a potential difference between the gate electrode of the program element and a diffusion layer of the program element does not exceed a dielectric strength voltage of the gate insulating film of the program element.

7. The semiconductor integrated circuit according to claim 6, further comprising a capacitor connected between a junction of the gate electrode of the program element and the first MOS transistor and the ground potential.

8. The semiconductor integrated circuit according to claim 1, further comprising a capacitor connected between a junction of the gate electrode of the program element and the first MOS transistor and the ground potential.

9. The semiconductor integrated circuit according to claim 1, wherein the first potential is a power supply potential, the second potential is the ground potential, the first MOS transistor is a pMOS transistor, the second MOS transistor is a pMOS transistor, and the program element is an nMOS transistor.

10. The semiconductor integrated circuit according to claim 9, wherein the writing potential is higher than the power supply potential.

11. A semiconductor integrated circuit, comprising:

a voltage supply terminal;

a first input terminal fed with a first input signal;

an output terminal that outputs an output signal;

a second input terminal fed with a second input signal;

a first MOS transistor having one end connected to the voltage supply terminal and a gate electrode connected to the first input terminal;

a second MOS transistor having one end connected to a first potential, an other end connected to the output terminal, and a gate electrode connected to the second input terminal; and a program element acting as a MOS transistor having one end connected to the other end of the second MOS transistor and an other end connected to a second potential lower than the first potential, wherein the program element includes a gate electrode having one end connected to an other end of the first MOS transistor and an other end connected to a ground potential and including a polysilicon film formed on a gate insulating film and a silicide film formed on the polysilicon film, in a writing mode for writing data into the program element, the voltage supply terminal has a potential set at a positive writing potential and the first MOS transistor is turned on for a predetermined period by the first input signal, so that electro migration is caused to occur on the silicide film, and in a reading mode for reading data stored in the program element, the voltage supply terminal has a potential set at a positive reading potential lower than the writing potential, the second MOS transistor is turned on for a predetermined period by the second input signal, and then the first MOS transistor is turned on for a predetermined period by the first input signal.

12. The semiconductor integrated circuit according to claim 11, wherein the gate electrodes of the first MOS transistor and the second MOS transistor each include the polysilicon film formed on the gate insulating film and the silicide film formed on the polysilicon film, and the silicide film of the gate electrode of the program element has a smaller thickness than the silicide films of the gate electrodes of the first MOS transistor and the second MOS transistor.

13. The semiconductor integrated circuit according to claim 12, wherein when the first MOS transistor is turned on in the writing mode, the writing potential is set such that a potential difference between the gate electrode of the program element and a diffusion layer of the program element does not exceed a dielectric strength voltage of the gate insulating film of the program element.

14. The semiconductor integrated circuit according to claim 13, further comprising a capacitor connected between a junction of the gate electrode of the program element and the first MOS transistor and the ground potential.

15. The semiconductor integrated circuit according to claim 12, further comprising a capacitor connected between a junction of the gate electrode of the program element and the first MOS transistor and the ground potential.

16. The semiconductor integrated circuit according to claim 11, wherein when the first MOS transistor is turned on in the writing mode, the writing potential is set such that a potential difference between the gate electrode of the program element and a diffusion layer of the program element does not exceed a dielectric strength voltage of the gate insulating film of the program element.

17. The semiconductor integrated circuit according to claim 16, further comprising a capacitor connected between a junction of the gate electrode of the program element and the first MOS transistor and the ground potential.

18. The semiconductor integrated circuit according to claim 11, further comprising a capacitor connected between a junction of the gate electrode of the program element and the first MOS transistor and the ground potential.

19. The semiconductor integrated circuit according to claim 11, wherein the first potential is the ground potential, the second potential is a power supply potential, the first MOS transistor is a pMOS transistor, the second MOS transistor is an nMOS transistor, and the program element is a pMOS transistor.

20. A semiconductor integrated circuit, comprising:
a voltage supply terminal;
a first input terminal fed with a first input signal;
an output terminal that outputs an output signal;
a second input terminal fed with a second input signal;
a first MOS transistor having one end connected to the voltage supply terminal and a gate electrode connected to the first input terminal;
a second MOS transistor having one end connected to a first potential, an other end connected to the output terminal, and a gate electrode connected to the second input terminal; and
a program element acting as a MOS transistor having one end connected to the other end of the second MOS transistor and an other end connected to a second potential lower than the first potential,
wherein the program element includes a gate electrode having one end connected to an other end of the first MOS transistor and an other end connected to a ground potential and including a polysilicon film formed on a gate insulating film and a silicide film formed on the polysilicon film.

* * * * *